United States Patent
Wang

(10) Patent No.: US 7,733,706 B2
(45) Date of Patent: Jun. 8, 2010

(54) FLASH MEMORY DEVICE AND ERASE METHOD THEREOF

(75) Inventor: Jong Hyun Wang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 182 days.

(21) Appl. No.: 11/856,697

(22) Filed: Sep. 17, 2007

(65) Prior Publication Data

US 2008/0080258 A1    Apr. 3, 2008

(30) Foreign Application Priority Data

Sep. 29, 2006  (KR) .................. 10-2006-0096208
Jun. 4, 2007   (KR) .................. 10-2007-0054607

(51) Int. Cl.
*G11C 16/04* (2006.01)

(52) U.S. Cl. ............. 365/185.33; 365/185.22; 365/189.09

(58) Field of Classification Search ......... 365/185.33, 365/185.22, 189.09
See application file for complete search history.

(56) References Cited

U.S. PATENT DOCUMENTS

| | | | | |
|---|---|---|---|---|
| 5,822,252 A | * | 10/1998 | Lee et al. ............... | 365/185.3 |
| 6,000,004 A | * | 12/1999 | Fukumoto ............... | 711/103 |
| 6,570,790 B1 | * | 5/2003 | Harari .................. | 365/185.29 |
| 6,711,054 B2 | * | 3/2004 | Kanamitsu et al. ...... | 365/185.03 |
| 6,891,752 B1 | * | 5/2005 | Bautista et al. ........ | 365/185.11 |
| 7,263,006 B2 | * | 8/2007 | Aritome ................ | 365/185.29 |
| 7,515,481 B2 | * | 4/2009 | Aritome ................ | 365/185.29 |

FOREIGN PATENT DOCUMENTS

| | | |
|---|---|---|
| CN | 1270394 | 10/2000 |
| CN | 1523367 | 8/2004 |
| JP | 08-063987 | 3/1996 |
| KR | 100187671 B1 | 1/1999 |
| KR | 1020060061086 A | 6/2006 |

* cited by examiner

*Primary Examiner*—Tuan T. Nguyen
(74) *Attorney, Agent, or Firm*—Townsend and Townsend and Crew LLP

(57) ABSTRACT

A flash memory device and an erase method thereof are included. The erase method includes performing an erase operation of a memory cell block including a plurality of pages, performing an erase verify operation and storing unerased page information about a page including unerased memory cells that have not been normally erased, and performing an additional erase operation of the page including the unerased memory cells based on the unerased page information. When the unerased memory cells exist, the erase verify operation and the additional erase operation are performed repeatedly.

10 Claims, 6 Drawing Sheets

FLASH MEMORY DEVICE AND ERASE METHOD THEREOF

CROSS-REFERENCES TO RELATED APPLICATIONS

The present application claims priority to Korean patent application number 10-2006-96208, filed on Sep. 29, 2006 and Korean patent application number 10-2007-54607, filed on Jun. 4, 2007, which are incorporated by reference in its entirety.

BACKGROUND OF THE INVENTION

The present invention relates to a flash memory device and an erase method thereof and, more particularly, to a flash memory device in which threshold voltage distributions of erased memory cells can be narrowed and an erase method thereof.

FIG. 1 is a circuit diagram illustrating an erase method of a conventional flash memory. The flash memory device includes a memory cell array 10, a block switch 20 and a X-decoder 30. The memory cell array 10 includes a plurality of memory cell blocks 11 (only one memory cell block is illustrated for convenience sake). Each of the memory cell blocks 11 includes a plurality of cell strings S0 to Sn. Each of the cell strings S0 to Sn includes a drain select transistor DST, a plurality of memory cells F0 to Fi and a source select transistor SST all of which are connected in series. The drain select transistors DST included in the respective cell strings S0 to Sn are connected to corresponding bit lines BL0 to BLn, and the source select transistors SST included in the respective cell strings S0 to Sn are connected in parallel to a common source line CSL.

The X-decoder 30 outputs a block select signal BSLk to select one of the plurality of memory cell blocks according to an address signal ADD.

The block switch 20 includes a plurality of NMOS transistors M0 to Mi+2. The plurality of NMOS transistors M0 to Mi+2 operate according to the block select signal BSLk of the X-decoder 30, and transfer voltages, applied through global word lines GWL and global select lines GDSL and GSSL, to the drain select line DSL, the word lines WL0 to WLi and the source select line SSL of a selected memory cell block 11.

An erase method of the conventional flash memory is described in detail below. An erase operation is carried out per memory cell block. One memory cell block 11 of the plurality of memory cell blocks is selected according to the address signal ADD applied to the X-decoder 30. 0V is applied to the word lines WL0 to WLi of the selected memory cell block 11, and a high voltage of about 20V is applied to a well of the memory cell block 11 for about 1.4 ms. Thus, the voltages of the drain select line DSL and the source select line SSL are boosted to about 20V due to capacitance coupling with the well. Further, threshold voltage distributions for the memory cells within the memory cell block 11 are moved from positive distributions to negative distributions by means of a high voltage difference between the word lines WL0 to WLi and the well.

An erase verify operation is performed once per memory cell block. To this end, an erase pulse should be long enough to sufficiently erase all cells F0 to Fi within the memory cell block 11. However, the memory cells erase at different speeds within the memory cell block 11, and threshold voltages after erase can vary widely. Further, an erase operation time can become long, and an interference influence occurring due to capacitance coupling between cells. In particular, it serves as an obstacle to degrade reliability of the operation in devices requiring narrow threshold voltage distributions as in multi-level cells.

BRIEF SUMMARY OF THE INVENTION

The present invention is directed towards narrowed threshold voltage distributions of erased cells by performing an erase operation, performing erase verification on a page-group basis, and then performing again an erase operation only on a page group including cells that have not been normally erased.

In an erase method of flash memory according to the present invention, an erase operation of a memory cell block including a plurality of pages is performed. An erase verify operation is performed, and unerased page information about a page including unerased memory cells that have not been normally erased is stored. An additional erase operation of the page including the unerased memory cells is performed based on the unerased page information. When the unerased memory cells exist, the erase verify operation and the additional erase operation are performed repeatedly.

The erase verify operation is performed on each page group with two or more pages being set to one page group.

At the time of the erase operation or the additional erase operation, an erase voltage is applied to a well of the memory cell block for 20 µs to 1500 µs.

The unerased page information includes an address of the page including the unerased memory cells, and the unerased page information is updated according to results of the erase verify operation.

A flash memory device according to the present invention includes a plurality of memory cell blocks respectively including a plurality of pages, a global control circuit to apply an erase operation voltage to each of the pages at the time of an erase operation, store unerased page information corresponding to a page including unerased memory cells that have not been normally erased through an erase verify operation, and apply the erase operation voltage so that only the unerased pages are erased again at the time of an additional erase operation, a X-decoder to output a block signal for selecting one of the memory cell blocks according to an address signal, and a block switch for transferring an erase operation voltage, output from the global control circuit, to a selected memory cell block according to the block select signal.

The erase verify operation is performed on each page group with two or more pages being set to one page group. At the time of the erase operation or the additional erase operation, an erase voltage is applied to a well of the memory cell block for 20 µs to 1500 µs.

The unerased page information includes an address of the page including the unerased memory cells, and the unerased page information is updated according to results of the erase verify operation.

DESCRIPTION OF SPECIFIC EMBODIMENTS

Now, specific embodiments according to the present patent will be described with reference to the accompanying drawings.

FIGS. 2 to 5 is a circuit diagram illustrating a flash memory device and an erase method thereof according to an embodiment of the present invention.

Figure 1:
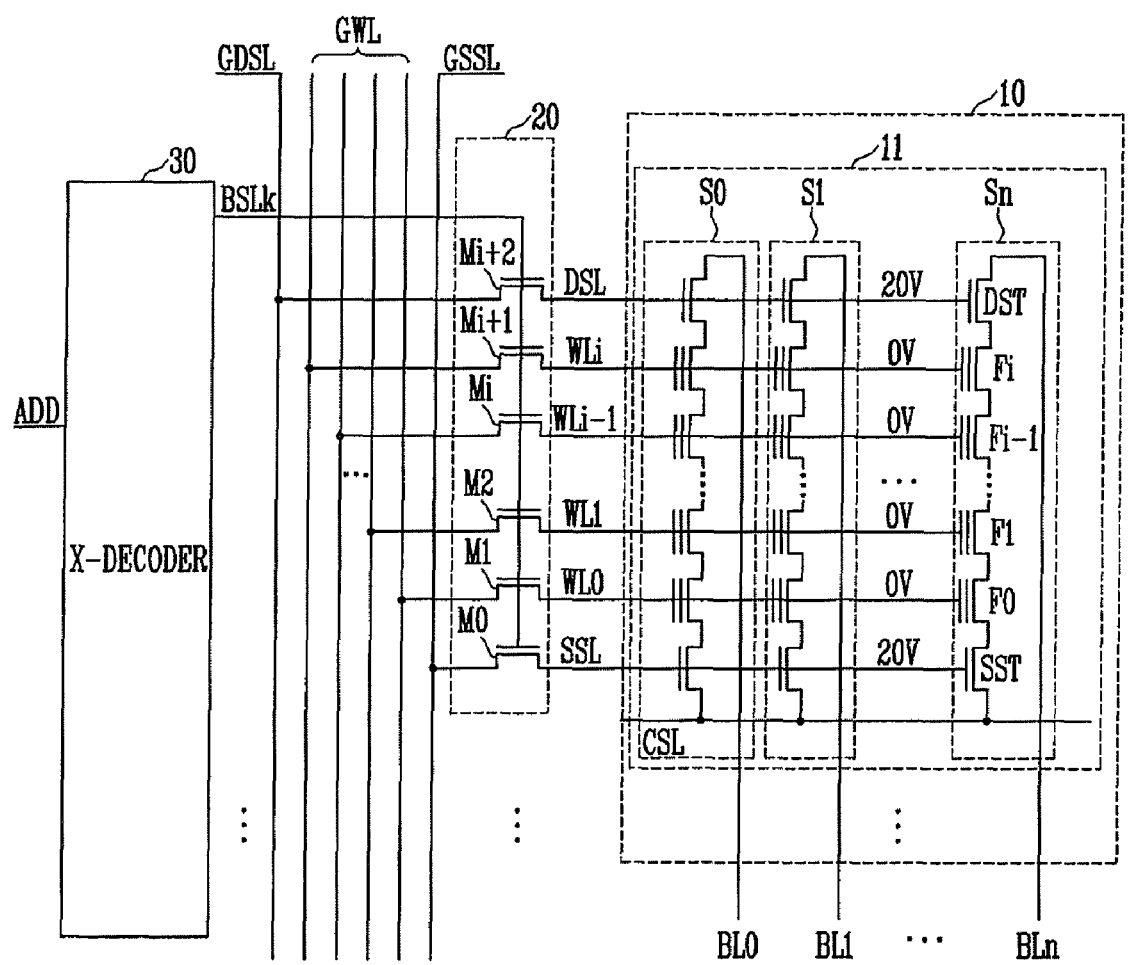
FIG. 1 is a circuit diagram illustrating an erase method of a conventional flash memory.
Figure 2:
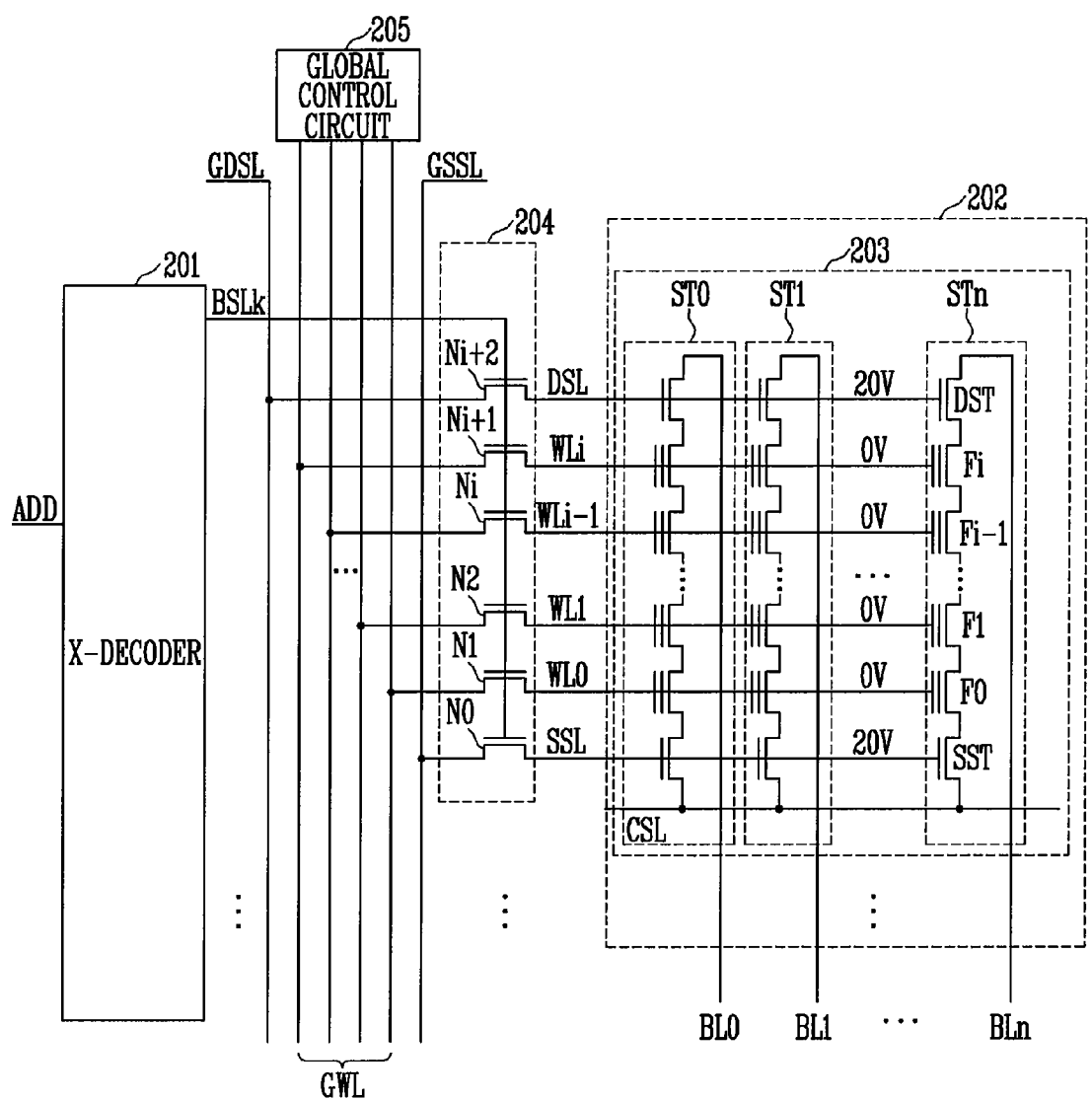
FIGS. 2 to 5 is a circuit diagram illustrating a flash memory device and an erase method thereof according to an embodiment of the present invention.

Referring to FIG. 2, a flash memory device according to an embodiment of the present invention includes a X-decoder 201, a global control circuit 205, a block switch 204 and a memory cell array 202.

The memory cell array 202 includes a plurality of memory cell blocks 203 (only one memory cell block is illustrated for convenience sake). Each memory cell block 203 includes a plurality of cell strings ST0 to STn. Each of the cell strings ST0 to STn has a structure in which a drain select transistor DST, a plurality of memory cells F0 to Fi and a source select transistor SST are connected in series. The drain select transistors DST included in the respective cell strings ST0 to STn are connected to corresponding bit lines BL0 to BLn, and the source select transistors SST included in the respective cell strings ST0 to STn are connected in parallel to a common source select line CSL. Meanwhile, the drain select transistors DST included in the respective cell strings ST0 to STn have gates connected to one another, thus becoming a drain select line DSL. The source select transistors SST included in the respective cell strings ST0 to STn have gates connected to one another, thus becoming a source select line SSL. Furthermore, the memory cells F0 to Fi have gates connected to one another, thus becoming respective word lines WL0 to WLi, and the respective word lines become a page unit. At this time, 2, 4, 8, 16 or 32 pages become one page group.

The X-decoder 201 outputs a block select signal BSLk to select one of the plurality of memory cell blocks according to an address signal.

The global control circuit 205 outputs operating voltages necessary for an erase operation (hereinafter, referred to an "erase operation voltage") to a plurality of global word lines GWL, respectively, and may output different levels of voltages.

In particular, the global control circuit 205 generates an erase operation voltage so that erase verification can be performed on a page-group basis at the time of an erase verify operation performed after an erase operation. Furthermore, the global control circuit 205 stores information (hereinafter, referred to an "unerased page information") about a page group on which the erase operation has not been normally performed (hereinafter, referred to an "unerased page group") according to the results of the erase verify operation. In the erase operation re-executed after the verify operation, the global control circuit 205 generates an erase operation voltage such that the erase operation can be performed only the unerased page group based on the unerased page information. A detailed operation is described in detail later on.

The block switch 204 transfers the erase operation voltage, output from the global control circuit 205, to a selected memory cell block 203 according to the block select signal BSLk of the X-decoder 201. The block switch 204 includes a switching element N0 connected between a global source select line GSSL and the source select line SSL, switching elements N1 to Ni+1 connected between the global word lines GWL and the word lines WL0 to WLi, and a switching element Ni+2 connected between a global drain select line GDSL and the drain select line DSL. The switching elements are turned on in response to the block select signal BSLk of the X-decoder 201.

An erase operation is described below. One memory cell block 203 is selected by the X-decoder 201. Erase voltages generated from the global control circuit 205 are applied to the drain select line DSL, and the respective word lines W0 to WLi, and the source select line SSL, respectively. In more detail, a ground voltage (i.e., 0V) is applied to all the word lines WL0 to WLi connected to the memory cell array 202. If an erase voltage of about 20V is applied to a well, voltages of the drain select line DSL and the source select line SSL are boosted to about 20V by means of capacitance coupling with the well, and the memory cells included in the selected memory cell block are erased by means of a high voltage difference between the word lines and the well. At this time, the erase voltage is applied to the well as an erase pulse in short bursts of about 20 μs to 1500 μs.

Since the erase voltage is applied to the well only for 20 μs to 1500 μs, which is short compared with the prior art, an erase speed is slow, so that there exist memory cells whose threshold voltage is not lower than a target voltage (i.e., 0V).

After the erase operation is completed, an erase verify operation is performed. In particular, in the present embodiment, as described above in relation to erase verification, two or more pages are set to one page group and erase verification is performed on a page-group basis.

One page group may consist of 1, 2, 4, 8, 16 or 32 pages. At this time, an erase verify speed may vary significantly when erase verification is performed per page group comprised of one page or when erase verification is performed per page group comprised of a plurality of pages. For example, an erase verify speed of a page group comprised of two pages is twice faster than an erase verify speed of a page group comprised of one page, so that time taken for erase verification can be shortened.

Figure 3:
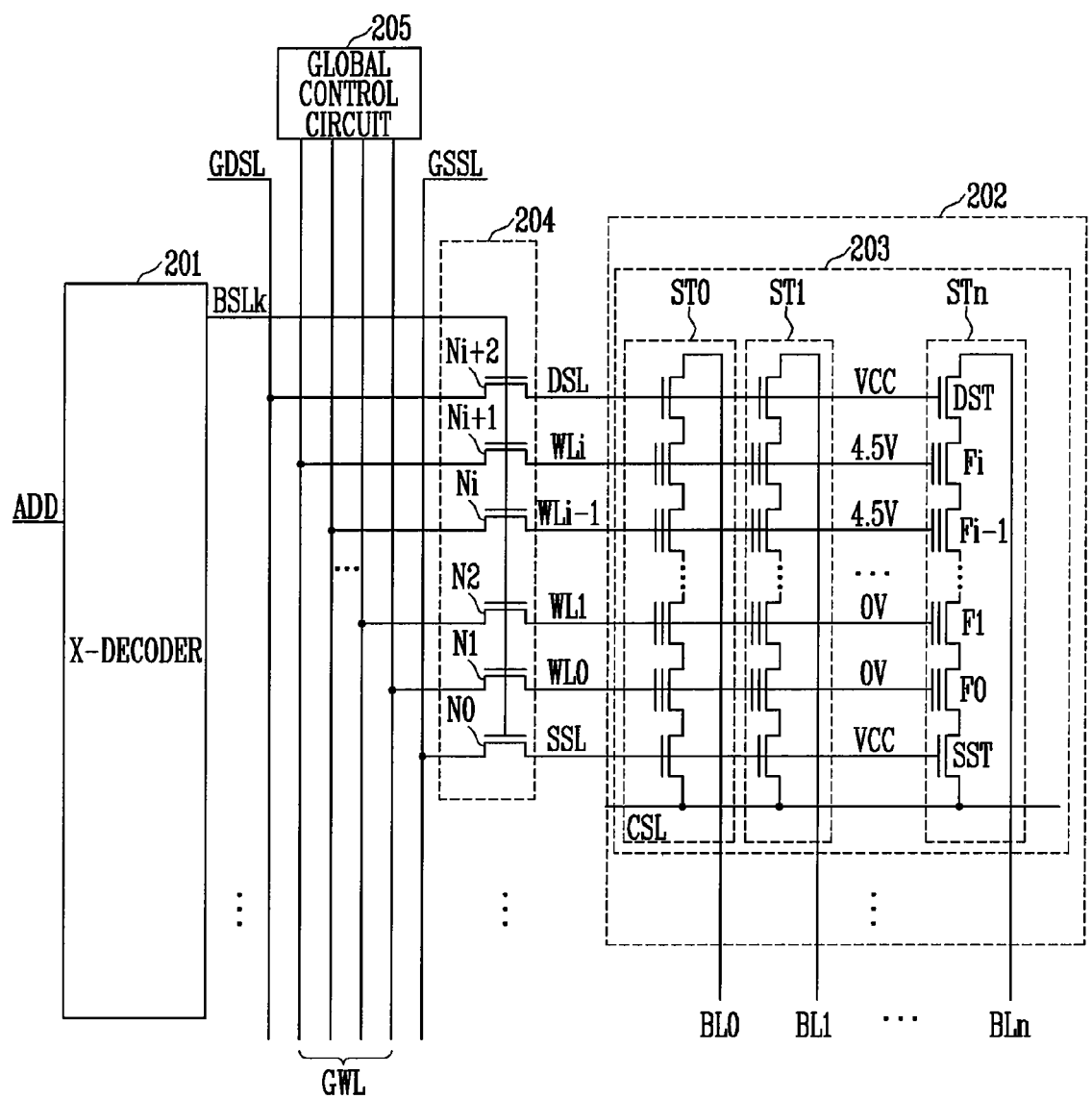

Referring to FIG. 3, in the event that two pages are set to one page group, 0V is applied to the first and second word lines WL0 and WL1 (i.e., a first page group), and a pass voltage (i.e., 4V to 5V), which is enough to turn on memory cells, is applied to the remaining word lines WL2 to WLi. Furthermore, an amount of current, which flows from each of the bit lines BL0 to BLn to the common source line CSL, is detected to measure threshold voltages of the memory cells F0 and F1 included in the first page group. At this time, if current flows, it is determined that the memory cells included in the first page group have all been normally erased. If current does not flow through a specific bit line (i.e., BLn), one or more of the memory cells F0 and F1, which are included in a string (i.e., STn) connected to the specific bit line BLn and connected to the first word line WL0 or the second word line WL1, become memory cells that have not been normally erased.

If there exist memory cells that have not been normally erased, the global control circuit 205 stores unerased page information (i.e., an address), that is, information about a corresponding page group. The erase verify operation is performed on a next page block according to the same method as described above.

Figure 4:
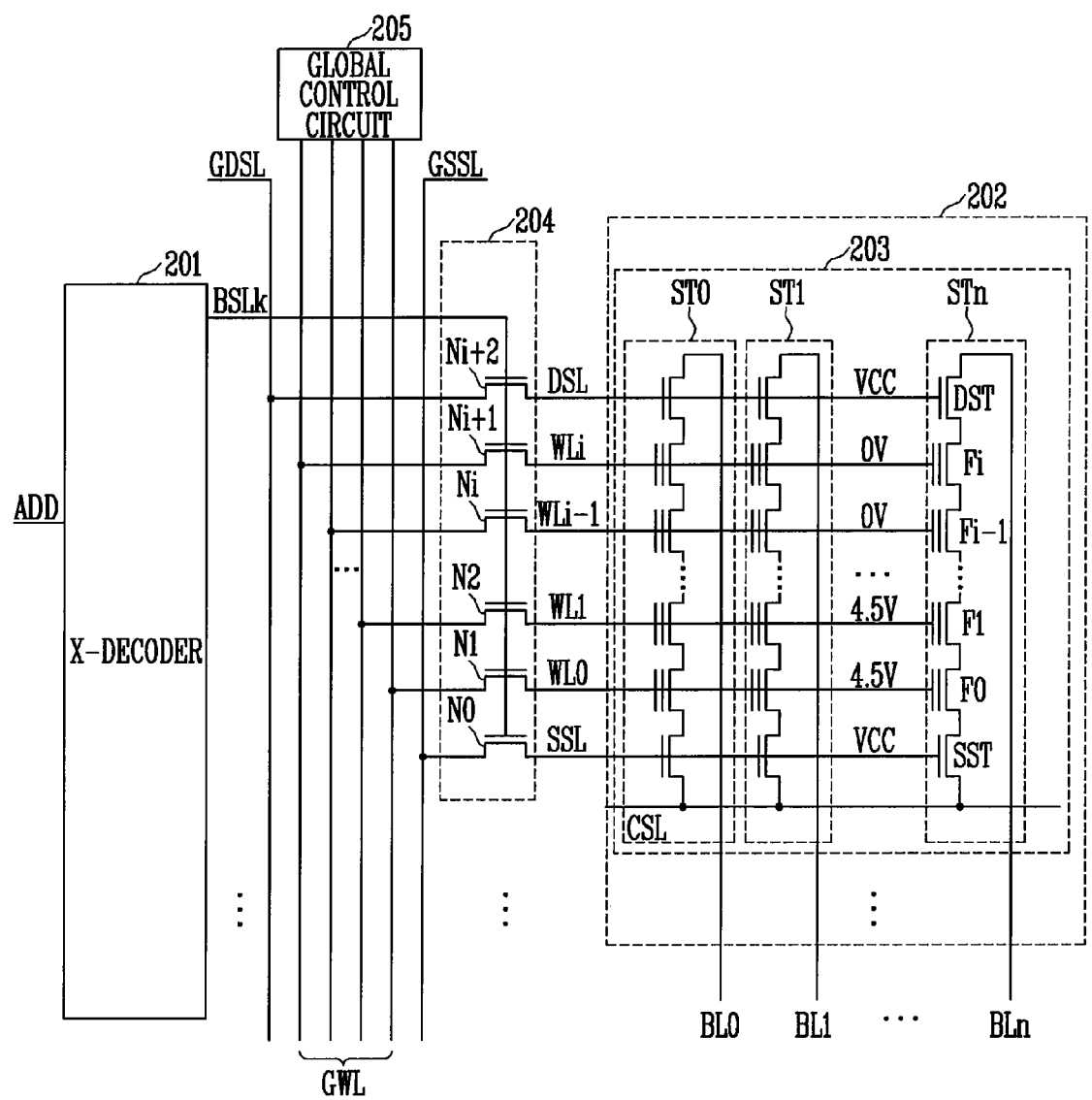

As in FIG. 4, the erase verify operation is performed until the last page groups (i.e., WLi−1 and WLi). Furthermore, information about the page group including the memory cells that have not been normally erased is stored in the global control circuit 205 while performing the erase verify operation every page group. As two or more pages are verified at the same time as in the above, an erase verify operation time can be shortened.

Meanwhile, an erase verify operation that is performed subsequently is performed only on unerased page groups, which can further shorten the erase verify time. A detailed operation is described later on.

Referring to FIG. 5, in order to erase again the memory cells on which the erase operation has not been normally performed, a second erase operation is carried out. The second erase operation is performed only on the unerased page groups based on the unerased page information stored in the global control circuit 205. In other words, the second erase operation is performed only on an unerased page group including memory cells on which the erase operation has not been normally performed. To this end, unlike the prior art in which the erase operation is performed on a block basis, the erase operation is performed only on an unerased page block including cells that have not been erased within a block. This is described below in detail.

Figure 5:
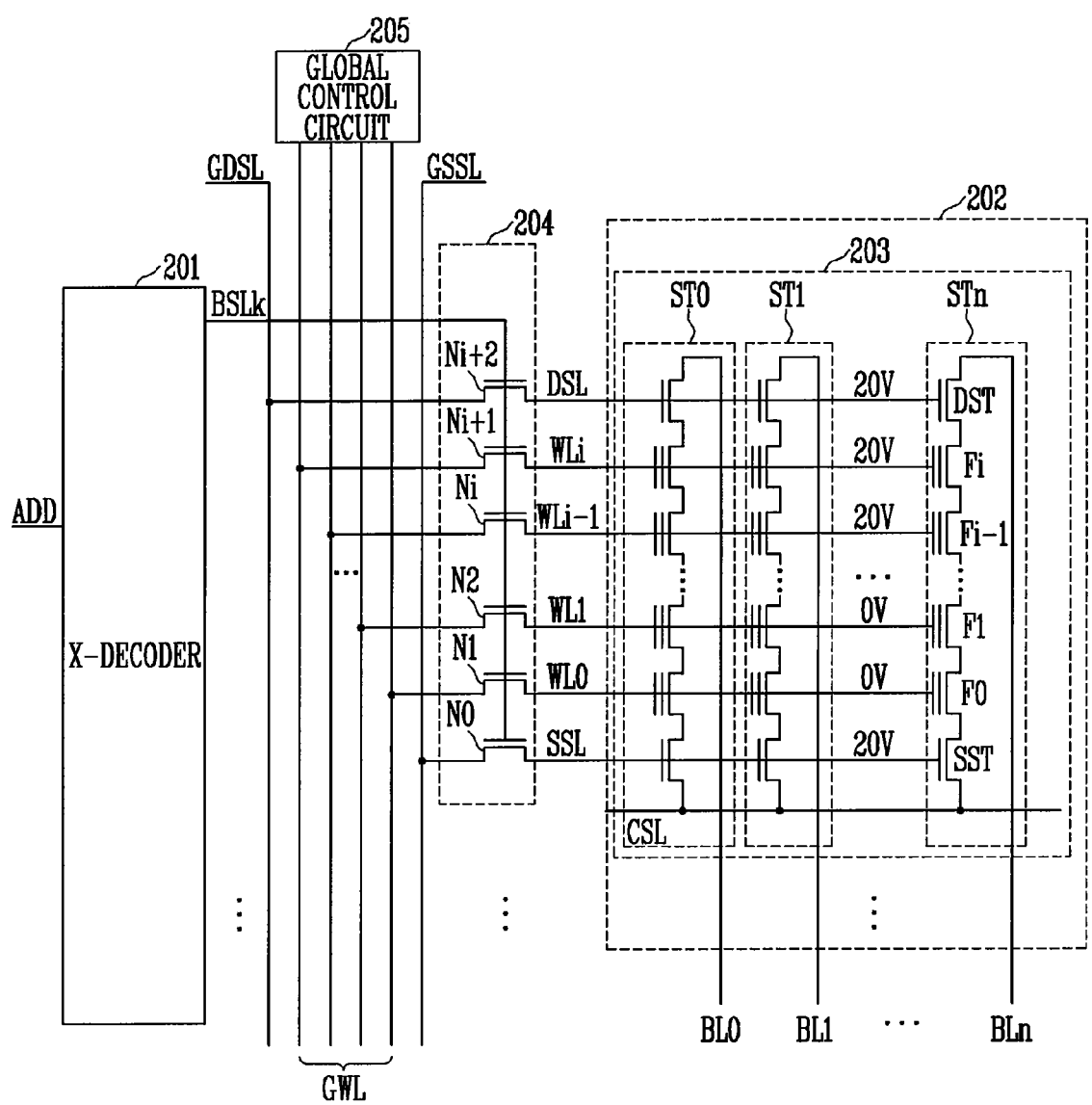

0V is applied to word lines (i.e., WL0 and WL1) included in an unerased page group so that the erase operation can be performed, and word lines included in the remaining page group become floated. If an erase voltage (i.e., 20V) is applied to the well in this state, a voltage difference between the word lines WL0 and WL1 and a board increases in the unerased page group, so that the erase operation is performed. However, in the remaining page groups, voltages of the word lines increase up to about 20V due to a capacitance coupling phenomenon, so that the erase operation is not performed. In a similar way, even in the second erase operation, the erase voltage is applied only for 20 μs to 1500 μs, which is short compared with the prior art. FIG. 5 illustrates an example in which only the first and second page groups WL0 and WL1 are selectively erased.

After the second erase operation is completed, a second erase verify operation is performed. The second erase verify operation is performed in the same manner as the first erase operation described above. However, the second erase verify operation is performed only on the unerased page block on which the first erase operation has been performed based on the unerased page information stored in the global control circuit 205, so that an erase verify operation time can be further shortened. Unerased page block information stored in the global control circuit 205 is also updated according to the results of the second erase verify operation.

As a result of the second erase verify operation, if all the memory cells are normally erased, the erase operation is finished. If there exist memory cells that have not been normally erased, the erase operation and the erase verify operation are performed repeatedly. The number of times in which the erase operation and the erase verify operation are repeatedly performed can be set within a range in which an erase operation time required in a system is not exceeded. If unerased memory cells exist even after the erase operation is performed until a set number of times, a corresponding block is treated as an invalid block.

It has been described above that information about unerased page blocks is stored in the global control circuit 205. However, information about normal page blocks on which the erase operation has been normally performed can be stored, and the erase operation and the erase verify operation can be re-executed on the remaining page blocks other than the normal page blocks.

Figure 6:
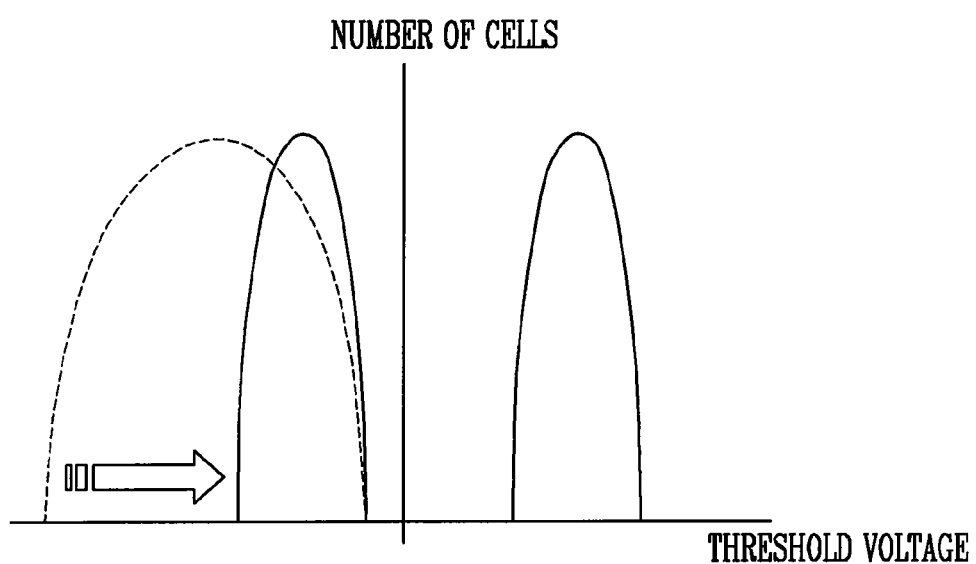
FIG. 6 is a graph illustrating threshold voltages by the erase and erase verify methods of the flash memory according to an embodiment of the present invention.

FIG. 6 is a graph illustrating threshold voltages by the erase and erase verify methods of the flash memory according to an embodiment of the present invention. If the erase operation is performed by the method according to an embodiment of the present invention, threshold voltages of memory cells are gradually lowered because an erase voltage pulse is applied in short bursts, which are short compared with the prior art. Thus, it can be seen that threshold voltage distributions of erased memory cells are narrowed. Further, erase verification can be performed per page group including two or more pages, and the erase operation can be performed only on an unerased page group depending on the erase verification results. In this case, time taken for an erase operation and an erase verify operation, which are performed again after the first erase operation and the first erase verify operation, can be minimized.

As described above, in accordance with an erase method of flash memory according to the present invention, erasure is performed by applying a short erase pulse and erase verification is performed on a page-group basis. Passed page groups do not experience next verification so that they are not further erased. It is therefore possible to narrow threshold voltage distributions, and improve the speed since the passed page groups do not experience subsequent erase verification.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. An erase method of flash memory, the method comprising:
   performing an erase operation of a memory cell block including a plurality of pages;
   performing an erase verify operation and storing unerased page information about a page including unerased memory cells that have not been normally erased; and
   performing an additional erase operation of the page including the unerased memory cells based on the unerased page information,
   wherein when the unerased memory cells exist, the erase verify operation and the additional erase operation are performed repeatedly.

2. The erase method of claim 1, wherein the erase verify operation is performed on each page group with two or more pages being set to one page group.

3. The erase method of claim 2, wherein at the time of the erase operation or the additional erase operation, an erase voltage is applied to a well of the memory cell block for 20 μs to 1500 μs.

4. The erase method of claim 1, wherein the unerased page information includes an address of the page including the unerased memory cells.

5. The erase method of claim 1, wherein the unerased page information is updated according to results of the erase verify operation.

6. A flash memory device, comprising:
   a plurality of memory cell blocks respectively including a plurality of pages;
   a global control circuit to apply an erase operation voltage to each of the pages at the time of an erase operation, store unerased page information corresponding to a page including unerased memory cells that have not been normally erased through an erase verify operation, and apply the erase operation voltage so that only the unerased pages are erased again at the time of an additional erase operation;
   a X-decoder to output a block signal for selecting one of the memory cell blocks according to an address signal; and
   a block switch for transferring an erase operation voltage, output from the global control circuit, to a selected memory cell block according to the block select signal.

7. The flash memory device of claim 6, wherein the erase verify operation is performed on each page group with two or more pages being set to one page group.

8. The flash memory device of claim 6, wherein at the time of the erase operation or the additional erase operation, an erase voltage is applied to a well of the memory cell block for 20 µs to 1500 µs.

9. The flash memory device of claim 6, wherein the unerased page information includes an address of the page including the unerased memory cells.

10. The flash memory device of claim 6, wherein the unerased page information is updated according to results of the erase verify operation.

* * * * *